US008410789B2

(12) United States Patent
Koelblin et al.

(10) Patent No.: US 8,410,789 B2
(45) Date of Patent: Apr. 2, 2013

(54) HIGH VOLTAGE ELECTRIC CABLE

(75) Inventors: Christian Koelblin, Meximieux (FR); Daniel Milan, Bourg en Bresse (FR); Christophe Mercado, Certines (FR); Frédéric Bechard, Belgique (BE); Franz Daenekas, Garbsen (DE)

(73) Assignee: Nexans, Paris (FR)

( * ) Notice: Subject to any disclaimer, the term of this patent is extended or adjusted under 35 U.S.C. 154(b) by 443 days.

(21) Appl. No.: 12/712,319

(22) Filed: Feb. 25, 2010

(65) Prior Publication Data

US 2010/0231228 A1 Sep. 16, 2010

(30) Foreign Application Priority Data

Feb. 27, 2009 (FR) ...................................... 09 51257

(51) Int. Cl.
*G01R 31/02* (2006.01)

(52) U.S. Cl. ....................................... 324/539; 174/107

(58) Field of Classification Search .................. 324/539, 324/541, 543, 544; 174/68.3, 107
See application file for complete search history.

(56) References Cited

U.S. PATENT DOCUMENTS

| | | | | |
|---|---|---|---|---|
| 4,398,058 | A * | 8/1983 | Gerth et al. | 174/106 D |
| 6,441,084 | B1 | 8/2002 | Lee et al. | |
| 2002/0188078 | A1 * | 12/2002 | Castellani et al. | 525/232 |
| 2004/0197057 | A1 * | 10/2004 | Lee et al. | 385/100 |

FOREIGN PATENT DOCUMENTS

FR 2378338 1/1977

OTHER PUBLICATIONS

"High Voltage Product Catalog 69kV-230kV, High Voltage Solutions", Feb. 6, 2013.
"T&D Update, Slender Sheaths Put Underground HV on a Diet", Mar. 2006.
"Benefits to utilities from semiconducting linear low density polyethylene jackets on medium voltage power distribution cables", Feb. 6, 2013.

* cited by examiner

*Primary Examiner* — Vincent Q Nguyen
(74) *Attorney, Agent, or Firm* — Sofer & Haroun, LLP

(57) ABSTRACT

An electric cable is provided having a conductor element, and successively around the conductor element an electrically-insulating layer; a metal screen and an outer protective sheath. The cable has an extruded outer layer surrounding the outer protective sheath, the extruded outer layer being directly in contact with the outer protective sheath, and being obtained from a composition containing more than 50.0 parts by weight of apolar polymer per 100 parts by weight of polymer in the composition, together with an electrically-conductive filler.

15 Claims, 1 Drawing Sheet

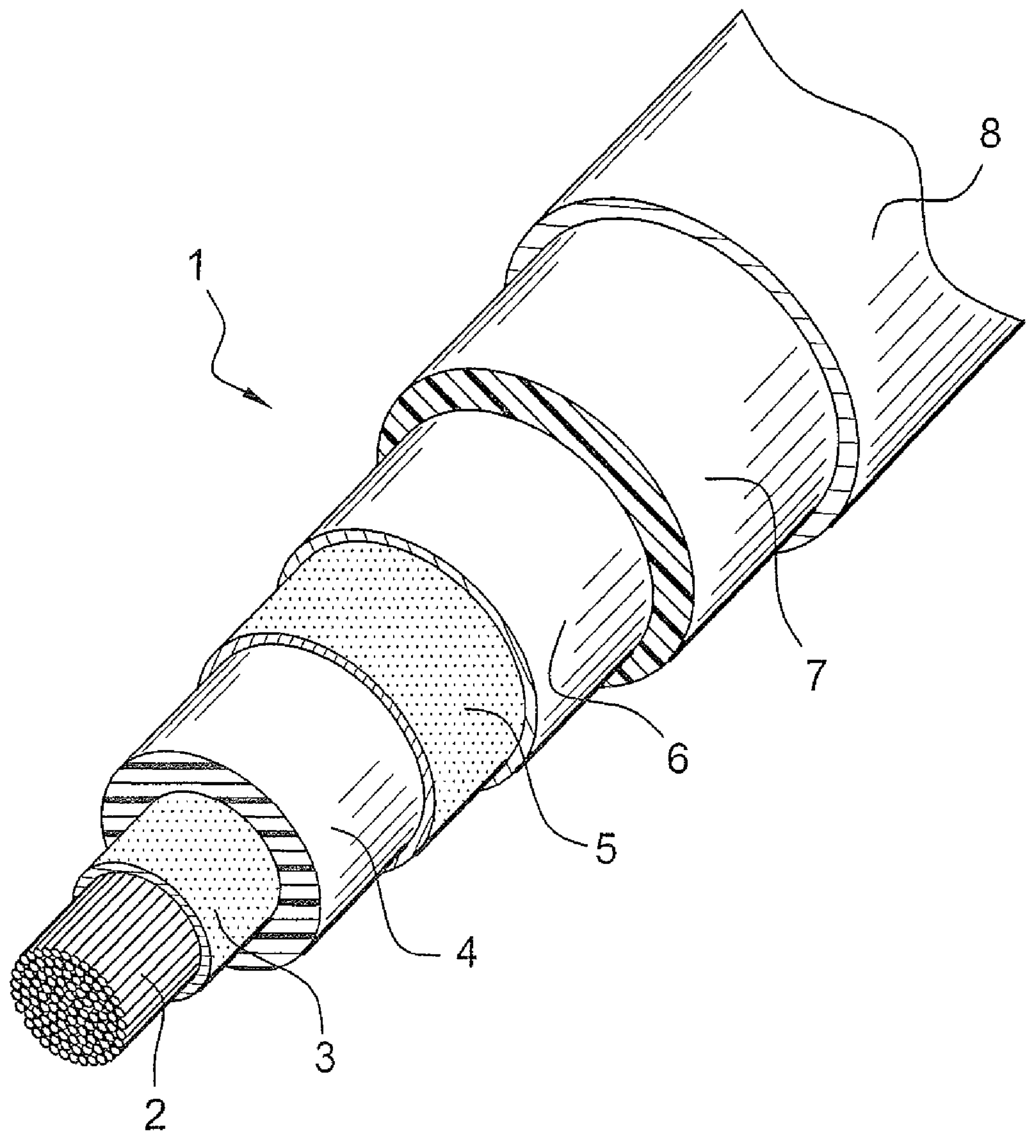
1
2
3
4
5
6
7
8

HIGH VOLTAGE ELECTRIC CABLE

RELATED APPLICATIONS

This application claims the benefit of priority from French Patent Application No. 09 51257, filed on Feb. 27, 2009, the entirety of which is incorporated herein by reference.

BACKGROUND

1. Field of the Invention

The present invention relates to an electric cable comprising a conductor element, and successively around said conductor element: an electrically-insulating layer; a metal screen; and an outer protective sheath.

The invention applies typically, but not exclusively, to the fields of high or very high voltage alternating current (AC) or direct current (DC) power cables. Such power cables are typically 60 kilovolt (kV) to 600 kV cables.

2. Background of the Invention

High or very high voltage power cables typically comprise a central conductor element and, successively and coaxially around said conductor element: an inner semiconductive screen; an extruded electrically-insulating layer; an outer semiconductive screen; a metal screen; and an outer protective sheath. The outer protective sheath is usually made out of materials that retard or withstand flame propagation. The sheath may be of the halogen-free flame-retardant (HFFR) type.

It has been observed that while such electric cables are being installed, more particularly while such cables are being placed or while junctions and terminations are being laid on such cables, it is possible for the outer protective sheath to be damaged, thereby creating a premature defect in the outer sheath that will lead to the cable deteriorating, in particular by moisture penetrating into said cable.

In order to verify whether the electric cable has been damaged while being installed, it is known to perform an electric test using a high voltage of constant polarity (DC) between the metal screen and a conductive covering deposited on said outer protective screen. The test may also be repeated throughout the lifetime of the electric cable.

A first technique consists in coating the outer protective sheath of the electric cable in a layer of graphite in powder form. Nevertheless, graphite powder is difficult to handle and runs the risk of dirtying sheathing workshops. Furthermore, it is difficult to distribute graphite powder uniformly over the entire periphery of the outer protective sheath of the electric cable because the adhesion of graphite powder on said outer sheath is not strong. Such non-uniformity in the layer of graphite on the outer protective sheath means that said electric test cannot be carried out reliably.

A second technique consists in applying a conductive varnish on the outer protective sheath of the electric cable. The disadvantage of that technique is the presence of volatile solvents in the conductive varnish that may be irritating and/or toxic. Furthermore, said varnish possesses mechanical properties that are very different from those of the outer protective sheath, which may compromise good adhesion of the varnish on the outer protective sheath while the electric cable is being handled.

OBJECT AND SUMMARY OF THE INVENTION

The object of the present invention is to mitigate the drawbacks of prior art techniques.

The present invention provides an electric cable comprising a conductor element, and successively around said conductor element: an electrically-insulating layer; a metal screen; and an outer protective sheath; the cable further comprising an extruded outer layer surrounding the outer protective sheath, said extruded outer layer being directly in contact with said outer protective sheath, and being obtained from a composition containing more than 50.0 parts by weight of apolar polymer per 100 parts by weight of polymer in the composition, together with an electrically-conductive filler. This outer layer is also referred to as the (electrically) "conductive" layer.

The term "conductive" used in the present invention should be understood as also covering "semiconductive".

The electric cable of the invention advantageously presents an extruded outer layer that is deposited uniformly directly onto the outer protective sheath with a contact surface that is substantially identical over the entire outer protective sheath. The assembly formed by the outer protective sheath and the extruded outer layer may thus be considered as being a dual-layer, and said dual-layer preferably does not include any intermediate layer interposed between the outer protective sheath and the outer layer.

Furthermore, the extruded outer layer presents adhesion that is significantly improved. Thus, it cannot be separated from the outer protective sheath during handling or installation of the electric cable.

Consequently, the electric test is easily applied to the electric cable of the invention and gives reliable results concerning the quality of the protection provided by the outer protective sheath.

Finally, the extruded outer layer offers optimized mechanical properties (e.g. breaking strength, elongation at break, and modulus of elasticity), and in particular it offers improved flexibility (i.e. modulus of elasticity), thereby advantageously making it possible to reduce the risk of said outer layer cracking, e.g. while the cable is being handled and/or installed.

Advantageously, the composition may comprise at least 60 parts by weight of apolar polymer per 100 parts by weight of polymer in the composition, preferably at least 80 parts by weight of apolar polymer per 100 parts by weight of polymer in the composition. In a particular embodiment, it may also comprise an apolar polymer (or an apolar polymer mixture) constituting the sole polymer in the composition.

The term "polymer" as such generally means a homopolymer or a copolymer, which polymer may be a thermoplastic polymer or an elastomer polymer. It is preferred so use thermoplastic polymers and she composition is then said to be a thermoplastic composition.

By way of example, the apolar polymer is a polyolefin, comprising homopolymers and copolymers of olefins, preferably of the low density type. Low density polyolefins typically have density that is not greater than 0.930 grams per cubic centimeter (g/cm$^3$), and preferably not greater than 0.920 g/cm$^3$. The density of polyolefins of the invention is determined conventionally by methods that are well known in the prior art and that are set out in detail in the ASTM D1505 or ISO 1183 standards. The low density polyolefin may be selected from linear low density polyethylenes (LLDPEs), very low density polyethylenes (VLDPEs), and ultra low density polyethylenes (ULDPEs), or a mixture thereof.

The apolar polymers of the invention thus include substantially no polar groups such as, for example: acrylate; carboxylic; or vinyl acetate groups.

According to a characteristic of the invention, the melting temperature of the apolar polymer may be at least 110° C., preferably at least 120° C. The melting temperature of the polymers of the present invention is measured conventionally at the melting peak of said polymer as obtained by differential scanning calorimeter (DSC) analysis with a temperature ramp of 10° C. per minute (° C./min) under a nitrogen atmosphere.

According to another characteristic of the invention, the fluidity index or mass flow rate (MFR) (in compliance with the ASTM D 1238 or ISO 1133 standard) of the apolar polymer may be not greater than 30 grams per 10 minutes (g/10 min) (190° C.; 2.16 kilograms (kg)), preferably not greater than 20 g/10 min, and in particularly preferred manner not greater than 10 g/10 min.

The apolar polymer may be obtained by polymerization in the presence of a conventional Ziegler-Natta or Philips catalyst. Preferably, a Ziegler-Natta LLDPE is used. More particularly, a Ziegler-Natta LLDPE is used that is known under the name C4-LLDPE or ethylene and butene copolymer.

In a particular embodiment, the composition further preferably comprises not more than 40 parts by weight of polar polymer per 100 parts by weight of polymer in the composition, more preferably not more than 20 parts by weight of polar polymer per 100 parts by weight of polymer in the composition. A polar polymer in the composition may serve to improve the dispersion of electrically-conductive fillers in the composition and to improve the adhesion of the extruded outer layer on the outer protective sheath as a function of the polar or apolar nature of said outer sheath.

By way of example, the polar polymer may be selected from copolymers of ethylene butyl acrylates (EBAs), copolymers of ethylene ethyl acrylates (EEAs), and copolymers of ethylene methyl acrylates (EMAs), or a mixture thereof.

In a particular embodiment, the composition of the invention may comprise 30% to 90% by weight of polymer.

The composition may comprise at least 10% by weight of electrically-conductive filler, preferably not more than 40% by weight of electrically-conductive filler, and in particularly preferred manner 15% to 30% by weight of electrically-conductive filler.

Below 10% by weight of electrically-conductive filler, the volume conductivity of the composition may be insufficient. Furthermore, above 40% by weight of electrically-conductive filler, the composition may become difficult to prepare and to work, and the composition also becomes economically unfavorable.

The electrically-conductive filler may be selected from carbon black, graphite, carbon nanotubes, doped inorganic fillers such as for example aluminum-doped zinc oxide having high and linear conductivity, and powders of intrinsically-conductive polymers, or a mixture thereof. The preferred electrically-conductive filler of the invention is carbon black.

Preferred carbon blacks of the invention have the following characteristics:

- a value for (di(n-butyl)phthalate) oil absorption as measured in application of the ASTM D 2414-90 standard, of at least 100 cubic centimeters per 100 grams ($cm^3$/100 g); and
- a BET specific surface value, as measured in compliance with the ASTM D 3037 standard, of at least 40 square meters per gram ($m^2$/g) (where BET comes from the initials of the originators of the measurement method).

The composition of the invention may further comprise other fillers, additives, stabilizers, and/or agents for protection against aging.

The stabilizers may typically be antioxidants, said antioxidants being preferably selected from: sterically-hindered phenolic antioxidants, such as, for example tetrakismethylene(3,5-di-t-butyl-4-hydroxy-hydrocinnamate)methane, 2,2'-thiodiethylene bis[3-(3,5-di-tert-butyl-4-hydroxphenyl) propionate], 2,2'-thiobis(6-t-butyl-4(methylphenol), or 2,2'-methylenebis(6-t-butyl-4-methylphenol); and phosphorus-based antioxidants such as for example, tris(2,4-di-t-butyl-phenyl)phosphite.

The type of stabilizer and its concentration in the composition should be selected as a function of the maximum temperature to which the polymer is subjected during production of the mixture and during working by extrusion onto the cable, and also depending on the maximum duration of exposure to said temperature.

The agents for providing protection against (thermal) aging may typically be thermal aging protection agents such as quinolines, e.g. such as poly-2,2,4-timethyl-1,2-dihydroquinoline (TMQ).

The stabilizers and/or the aging protection agents may be added to the composition of the invention in a quantity of not more than 2% by weight, preferably a quantity lying in the range 0.2% to 1% by weight.

The other fillers may be halogen-free inorganic fillers for improving the fire behavior of the composition, such as for example white fillers, and more particularly halogen-free flame retardant (HFFR) fillers such as aluminum trihydrate (ATH), magnesium dihydrate (MDH), antimoine trioxide, or zinc borate. Said white fillers may also include surface treatment, e.g. to make it easier to incorporate them in the molten polymer while mixing the composition or to improve their effectiveness against the effects of fire. The composition of the invention may thus advantageously further comprise a flame-retardant filler.

The other fillers may also be fillers suitable for reducing the phenomenon of incandescent dripping during a fire, preferably a halogen-free anti-drip agent.

The other fillers, taken independently of one another or in combination, may be added to the composition of the invention in a quantity not greater than 50% by weight, and preferably in a quantity not greater than 30% by weight. Preferably, the composition may comprise at least 10% by weight of said other fillers.

In a particular embodiment, the outer layer may optionally be cross-linked.

Preferably, the outer layer has a thickness of not more than 400 micrometers (μm), preferably not more than 300 μm. This thickness is related to an outer layer said to be of the "skin." type.

The outer protective sheath of the cable of the invention preferably presents hardness on the Shore D scale of at least 50, in application of the ISO 868 standard.

Adhesion of the outer layer may be improved by the nature of the outer protective sheath, in particular when said outer sheath is of the apolar type, and is optionally filled with inorganic fillers, in particular flame-retardant fillers.

In order to guarantee that an electric cable is indeed a halogen-free flame-retardant cable, the various polymer layers of the electric cable of the invention preferably do not include any halogen compounds. Such halogen compounds may be of any kind, such as for example fluorinated polymers or chlorinated polymers such as polyvinyl chloride (PVC), halogen-containing plasticizers, halogen-containing inorganic fillers, etc. . . . .

According to an additional characteristic of the electric cable of the invention, the cable further comprises an inner semiconductive screen between the conductor elements and the electrically-insulating layer, and an outer semiconductor screen between the electrically-insulating layer and the metal screen.

The electric cable as formed in this way is referred to as a high or very high voltage power cable.

The invention also provides a method of measuring electric current in the outer protective sheath of the electric cable of the invention, the method comprising the steps consisting in:

i) applying a voltage between the extruded outer layer, said outer layer being connected to ground, and the metal screen of the electric cable, said voltage being provided by a high voltage DC source of variable voltage; and ii) varying the voltage of the high voltage source to verify voltage stability and the values of the load current delivered by the high voltage source, in order to identify whether the outer protective sheath includes a structural defect.

The metal screen may be put into contact with the high voltage source, e.g. by cutting a "window" through the outer protective sheath in order to place an electrode in the metal screen. The voltage is increased up to a predetermined value and is then left active for a predetermined duration. By way of example, according to the NF-C.33.253 standard, the predetermined value for the voltage is set at 20 kV and The value for the duration is set at 15 minutes.

When a drop is observed in the value of the voltage and also art increase and/or art instability is observed in the load current that is delivered, the outer protective sheath has a defect. The drop in the voltage value, and also the increase and/or the instability of the delivered load current are easily identifiable, respectively by using a high voltage voltmeter in combination with a voltage reducer (for measuring the voltage), and a resistive shunt in combination with a suitable voltmeter (for measuring the current).

The defect can then be located, e.g. by electrical echo measurement, and then the damaged portion of the cable can be repaired.

BRIEF DESCRIPTION OF THE DRAWING

Other characteristics and advantages of the present invention appear in the light of the description of a non-limiting example of an electric cable of the invention, and given with reference to FIG. 1.

FIG. 1 is a diagrammatic exploded perspective view of an electric cable constituting a preferred embodiment of the invention.

MORE DETAILED DESCRIPTION

For reasons of clarity, only elements that are essential for understanding the invention are shown, and they are shown diagrammatically and not to scale.

The high voltage or very high voltage power cable 1 shown in FIG. 1 comprises a central conductor element 2, in particular made of copper or aluminum, and successively and coaxially around the said element: an "inner" semiconductive layer 3; an electrically insulating layer 4; an "outer" semiconductive layer 5; a metal screen 6 for grounding and/or protection; an outer protective sheath 7; and an extruded outer layer 8 in accordance with the invention.

Conventionally, the layers 3, 4, and 5 are layers that are extruded and cured using methods well known to the person skilled in the art.

The presence of the semiconductive layers 3 and 5, is preferred, but not essential. The structure of the protection, as constituted by the metal screen 6 and the outer protective sheath 7, may further include other protective elements. The protective structure of the cable is itself of known type and lies outside the context of the present invention.

EXAMPLES

Composition 1 (comparative test): the thermoplastic semiconductive composition sold by the supplier Dow Chemicals under the reference DHDA 7708-BK.

Composition 2 (comparative test) the thermoplastic semiconductive composition sold by the supplier Kyungwon New Materials Inc. under the reference Pramkor 7001.

Composition 3, composition comprising: 74.5% by weight of LLDPE (apolar thermoplastic polymer) sold by the supplier Polimeri Europa SpA under the reference Flexirène CL10 (density 0.918 g/cm$^3$; fluidity index MFR=2.6 g/10 min; melting temperature=121° C.);

- 25% by weight of carbon black sold by the supplier Cabot Corporation under the reference Vulcan XC-500; and
- 0.5% by weight of an antioxidant sold by the supplier Flexsys N.V. under the reference Flektol TMQ.

Composition 4, composition comprising:

- 54.8% by weight LLDPE (apolar thermoplastic polymer) sold by the supplier Polimeri Europa SpA under the reference Flexirène CL10 (density 0.918 g/cm$^3$; fluidity index MFR=2.6 g/10 min; melting temperature=121° C.);
- 29.8% by weight of magnesium dihydrate (MDH) sold by the supplier Albemarle Corporation under the reference Magnifin H5A;
- 15% by weight of carbon black sold by the supplier Cabot Corporation under the reference Vulcan XC-72; and
- 0.4% by weight of an antioxidant sold by the supplier Ciba Specialty Chemicals Inc. under the reference Irganox 1010FF.

Composition 5, composition comprising:

- 49.6% by weight LLDPE (apolar thermoplastic polymer) sold by the supplier Polimeri Europa SpA under the reference Flexirène CL10 (density 0.918 g/cm$^3$; fluidity index MFR=2.6 g/10 min; melting temperature=121° C.);
- 35.0% by weight of magnesium dihydrate (MDH) sold by the supplier Albemarle Corporation under the reference Magnifin H5A;
- 15% by weight of carbon black sold by the supplier Cabot Corporation under the reference Vulcan XC-72; and
- 0.4% by weight of an antioxidant sold by the supplier Ciba Specialty Chemicals Inc. under the reference Irganox 1010FF.

The compositions 1 to 5 were mixed in a continuous mixer or a two-screw extruder. The polymer, possibly together with additives, was introduced by suitable measuring means into the mixer, with the polymer being in the molten state. Thereafter the electrically-conductive fillers, and possibly other fillers, were introduced into the molten mass and homogenized. The resulting mixture was granulated using a granulator device.

The granules obtained in the granulation step were extruded, the extrudate being deposited around an outer protective sheath (also extruded) of thickness lying in the range 2 millimeters (mm) to 3 mm surrounding a metal wire having a section of 1.5 square millimeters (mm$^2$). The respective thicknesses of the outer layers, obtained respectively from extruded compositions 1 to 3 lay in the range 0.15 mm to 0.2 mm.

The dual-layers of the electric cables as obtained in this way were subjected to visual inspection.

The natures of the protective sheaths constituting the dual-layers are set out in Table 1 below.

TABLE 1

| | Composition 1 | Composition 2 | Composition 3 | Composition 4 | Composition 5 |
|---|---|---|---|---|---|
| HFFR sheath | Considerable detachment of the outer layer | Considerable detachment of the outer layer | No detachment of the outer layer | NM* | No detachment of the outer layer |

*NM = characteristic not measured

The HFFR sheath (or outer protective sheath) of Table 1 was made of an HFFR material sold by the supplier Nexans under the reference HS3411-T.

Given the visual qualitative results set out in Table 1, only thermoplastic compositions of the invention can be extruded on the outer protective sheath of the cable without significant detachment of the outer layer being observed, in contrast with compositions 1 and 2.

TABLE 2

| | Composition 1 | Composition 2 | Composition 3 | Composition 4 | Composition 5 |
|---|---|---|---|---|---|
| Breaking strength (MPa) | 11.7 | 29.8 | 24.2 | 16.5 | 15.5 |
| Elongation at break (%) | 450 | 513 | 575 | 518 | 454 |
| Modulus of elasticity (MPa) | NM* | 1620 | 1046 | 1056 | 1267 |
| Volume resistivity at 23° C. (Ω · m) | 0.25 | 10 | 0.22 | 0.36 | 0.25 |
| Hardness (Shore D) | 55 | NM* | 57 | NM* | NM* |
| Duration of combustion with solid bars in the vertical direction (seconds) | NM* | NM* | 259 | 298 | 366 |
| Assessment of catching fire during the solid bar combustion test | NM* | NM* | Easy | Moderate | Difficult |

*NM = value or characteristic not measured

The mechanical properties (breaking strength, elongation at break, and modulus of elasticity) and also the volume resistivity at 23° C. were measured using test pieces taken from extruded tapes (having a thickness of 0.3 mm) as obtained from compositions 1 to 5.

The breaking strength and the elongation at break were determined using the IEC 60811-1-1 standard, the test pieces being of the ISO 37-2 "dumbbell" type and the traction speed being 100 millimeters per minute (mm/min).

The modulus of elasticity (or Young's modulus) was determined using traction testing in compliance with the ISO 527-1 or ASTM D 638 standard, the test pieces being of the ISO 37-2 "dumbbell" type and the traction speed used being 100 mm/min. The modulus of elasticity serves to characterize the stiffness of the material. The higher its value, the stiffer the material.

The volume resistivity was determined using the ASTM D991 standard or a method derived from the ISO 3915 standard.

The Shore D value was determined using a hardness meter in application of the ISO 868 or the ASTM D 2240 standard.

The duration of combustion in the vertical direction of a flame of solid, bars was determined as follows. Solid bars having a diameter of 4 mm were extruded using each of the compositions 1 to 5. These bars were then dried for 48 hours (h) at a temperature of 70° C. in a hot air stove in order to eliminate any possible influence of absorbed moisture on fire behavior. After drying, the bars were cut into pieces each having a length of 22 centimeters (cm). A laboratory retort stand was placed under a fume exhaust hood and a clamp was placed on the stand at a height of 30 cm. The clamp held a short rod of the retort stand in the horizontal direction. A second clamp was fastened to the end of said rod. Each bar was fastened vertically in the second clamp, with clamping taking place over a length of 2 cm. The free length available for the flame was thus 20 cm. The bar was set alight using a butane flame. The time between the bar catching fire (i.e. the moment when the bar burns on its own) and the flame going out completely, was measured using a timer. For each of the tested compositions, three bars were burnt and the mean value (in seconds) of the combustion durations obtained in this way was calculated. These values are interpreted as follows: the longer the duration of combustion, with this applying only for combustion over the entire length and with the bar being consumed fully over 20 cm, the greater the effectiveness of the flame retardant filler for retarding combustion.

To assess the possible circumstance of the flame going out before the bar is consumed (which would be the best possible circumstance), the criterion of assessing the ease with which the bar catches fire was introduced (when testing combustion of solid bars). The greater the difficulty of making the bar catch fire, the more pronounced the flame retardant effect.

The results summarized in Table 2 show that compositions 3 to 5 of the invention present mechanical properties and resistivity properties that are significantly improved compared with the comparative tests, while nevertheless retaining very good adhesion on the outer protective sheath (see results of Table 1).

Concerning the modulus of elasticity, the smaller values of the compositions 3 to 5 compared with composition 2 show that the compositions of the invention are indeed more mechanically flexible, even concerning compositions 4 and 5 with large amounts of filler. This increased flexibility reduces the risk of the outer layer cracking during handling while the cable is being handled and/or installed.

The compositions 4 and 5 that also contain a flame retardant filler of the HFFR type do indeed show an increased flame retarding effect in comparison with composition 3, with this being particularly pronounced for composition 5.

Thus, the fire behavior of the assembly constituted by said conductive outer layer of the invention and the HFFR type protective outer sheath is most favorable, said assembly also presenting very good mechanical properties, good electrical, conductivity, and good adhesion.

What is claimed is:

1. An electric cable comprising:

a conductor element, and successively around said conductor element:

an electrically-insulating layer;

a metal screen; and an outer protective sheath; the cable further having an extruded outer layer surrounding the outer protective sheath, said extruded outer layer being directly in contact with said outer protective sheath, and being obtained from a composition containing more than 50.0 parts by weight of apolar polymer per 100 parts by weight of polymer in the composition, together with an electrically-conductive filler.

2. A cable according to claim 1, wherein the composition comprises at least 60 parts by weight of apolar polymer per 100 parts by weight of polymer in the composition.

3. A cable according to claim 2, wherein the composition comprises at least 80 parts by weight of apolar polymer per 100 parts by weight of polymer in the composition.

4. A cable according to claim 1, wherein the apolar polymer is selected from the group consisting of linear low density polyethylenes, very low density polyethylenes, and ultra low density polyethylenes, or a mixture thereof.

5. A cable according to claim 1, wherein the composition further comprises not more than 40 parts by weight of polar polymer per 100 parts by weight of polymer in the composition.

6. A cable according to claim 5, wherein the polar polymer is selected from the group consisting of copolymers of ethylene butyl acrylates, copolymers of ethylene ethyl acrylates, and copolymers of ethylene methyl acrylates, or a mixture thereof.

7. A cable according to claim 5, wherein the composition further comprises not more than 20 parts by weight of polar polymer per 100 parts by weight of polymer in the composition.

8. A cable according to claim 1, wherein the composition comprises at least 10% by weight of electrically-conductive filler.

9. A cable according to claim 1, wherein the composition comprises not more than 40% by weight of electrically-conductive filler.

10. A cable according to claim 1, wherein the electrically-conductive filler is selected from the group consisting of carbon black, graphite, carbon nanotubes, doped inorganic fillers, and powders of intrinsically-conductive polymers, or a mixture thereof.

11. A cable according to claim 1, wherein the outer layer has a thickness of not more than 400 μm.

12. A cable according to claim 11, wherein the outer layer has a thickness of not more than 300 μm.

13. A cable according to claim 1, wherein the outer protective sheath has hardness on the Shore D scale of at least 50 in application of the ISO 868 standard.

14. A cable according to claim 1, further comprising an inner semiconductive screen between the conductor elements and the electrically-insulating layer, and an outer semiconductor screen between the electrically-insulating layer and the metal screen.

15. A cable according to claim 1, wherein the composition further comprises a flame-retardant filler.

* * * * *